(12) United States Patent
Ma et al.

(10) Patent No.: US 11,119,538 B2
(45) Date of Patent: Sep. 14, 2021

(54) FLEXIBLE DISPLAY PANEL AND FLEXIBLE DISPLAY DEVICE

(71) Applicant: BOE Technology Group Co., Ltd., Beijing (CN)

(72) Inventors: Yongda Ma, Beijing (CN); Xueguang Hao, Beijing (CN); Yong Qiao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 9 days.

(21) Appl. No.: 16/616,272

(22) PCT Filed: Apr. 22, 2019

(86) PCT No.: PCT/CN2019/083718
§ 371 (c)(1),
(2) Date: Nov. 22, 2019

(87) PCT Pub. No.: WO2019/206092
PCT Pub. Date: Oct. 31, 2019

(65) Prior Publication Data
US 2020/0089281 A1 Mar. 19, 2020

(30) Foreign Application Priority Data
Apr. 28, 2018 (CN) .......................... 201820640564.5

(51) Int. Cl.
*H05K 1/00* (2006.01)
*H05K 1/02* (2006.01)
(Continued)

(52) U.S. Cl.
CPC ............ *G06F 1/1652* (2013.01); *G09F 9/301* (2013.01)

(58) Field of Classification Search
CPC .. H05K 1/00; H05K 1/02; H05K 1/03; H05K 1/11; H05K 3/30; H05K 3/306;
(Continued)

(56) References Cited

U.S. PATENT DOCUMENTS 8,093,502 B2 * 1/2012 Mikado ................ H05K 3/4691
174/255
9,980,326 B2  5/2018 Kim et al.
(Continued)

FOREIGN PATENT DOCUMENTS

CN     206058795 U    3/2017
CN     206148473 U    5/2017
(Continued)

OTHER PUBLICATIONS

Mar. 3, 20210—KR First Office Action Appn 20197037311 with English translation.
May 2, 20217—IN First Office Action Appn 201917047295.

*Primary Examiner* — Xiaoliang Chen
(74) *Attorney, Agent, or Firm* — Banner & Witcoff, Ltd.

(57) ABSTRACT

A flexible display panel and a flexible display device are provided. The flexible display panel includes: a first insulating layer; a plurality of leads disposed above the first insulating layer, the plurality of leads passing through a predetermined bending region of the flexible display panel; a second insulating layer above respective one of the leads; where at least one of the leads is provided with at least one first hollow portion in the predetermined bending region, and the first insulating layer and the second insulating layer are connected via the at least one first hollow portion. In this way, product performance can be improved.

15 Claims, 5 Drawing Sheets

(51) Int. Cl.
*H05K 1/03* (2006.01)
*H05K 1/11* (2006.01)
*H05K 3/30* (2006.01)
*G06F 1/16* (2006.01)
*H05B 33/04* (2006.01)
*H05B 33/06* (2006.01)
*G09F 9/30* (2006.01)

(58) Field of Classification Search
CPC ........... G06F 1/16; H05B 33/04; H05B 33/06; G12F 1/1333; G12F 1/1362
USPC ........ 361/749, 795; 174/250, 252, 254, 260; 262/249.06, 418; 362/249.06, 418
See application file for complete search history.

(56) References Cited

U.S. PATENT DOCUMENTS

| | | | | |
|---|---|---|---|---|
| 2005/0122700 A1* | 6/2005 | Kim | ....................... | H05K 3/361 361/795 |
| 2009/0120670 A1* | 5/2009 | Lo | ......................... | H05K 1/028 174/254 |
| 2013/0087375 A1* | 4/2013 | Tsunoi | ................. | H05K 1/0278 174/260 |
| 2014/0042406 A1* | 2/2014 | Degner | ............... | H01L 27/3297 257/40 |
| 2014/0268780 A1* | 9/2014 | Wang | ....................... | F21S 4/22 362/249.06 |
| 2015/0003083 A1* | 1/2015 | Uehara | .................... | F21S 43/15 362/418 |
| 2017/0111990 A1* | 4/2017 | Im | ......................... | H05K 1/0281 |
| 2017/0192460 A1* | 7/2017 | Watanabe | ................. | G09F 9/00 |
| 2018/0092166 A1* | 3/2018 | Kim | ..................... | H01L 51/0097 |
| 2018/0182983 A1* | 6/2018 | Bae | ........................ | B32B 15/085 |
| 2018/0324939 A1* | 11/2018 | Wang | ....................... | H01L 27/124 |
| 2020/0221569 A1* | 7/2020 | Shi | ......................... | H05K 1/028 |

FOREIGN PATENT DOCUMENTS

| | | |
|---|---|---|
| KR | 20170139176 A | 12/2017 |
| WO | 2013154318 A1 | 10/2013 |

* cited by examiner

FLEXIBLE DISPLAY PANEL AND FLEXIBLE DISPLAY DEVICE

The application is a U.S. National Phase Entry of International Application No. PCT/CN2019/083718 filed on Apr. 22, 2019, designating the United States of America and claiming priority to Chinese Patent Application No. 201820640564.5 filed on Apr. 28, 2018. The present application claims priority to and the benefit of the above-identified applications and the above-identified applications are incorporated by reference herein in their entirety.

TECHNICAL FIELD

Embodiments of the present disclosure relate to a flexible display panel and a flexible display device.

BACKGROUND

A flexible display panel realizes the bendability of the flexible display panel by formation of a display unit on a flexible carrier, thereby improving a user's operating experience and expanding the application scenario of the display panel.

Because a flexible display panel is provided with a plurality of leads for transmitting signals, when the extending direction of the leads passes through a region where the flexible display panel is bent during use or production, the leads is prone to separate from an upper insulating layer and an underlying insulating layer at a section in the bending region due to the separation force generated by the bending, resulting in the failure of conductive layer (i.e., the leads) separation from the insulating layers, thereby affecting product performance.

SUMMARY

An embodiment of the present disclosure provides a flexible display panel, including: first insulating layer; a plurality of leads on the first insulating layer passing through a predetermined bending region of the flexible display panel; a second insulating layer on respective one of the leads; at least one of the leads is provided with at least one first hollow portion in the predetermined bending region, and the first insulating layer and the second insulating layer are connected by the at least one first hollow portion.

In one example, a same lead is provided with a plurality of first hollow portions in the predetermined bending region, and respective one of the first hollow portions has a first opening facing the first insulating layer; in the predetermined bending region, in the same lead, an area of a first opening of a first hollow portion closer to a bending edge is larger than an area of a first opening of a first hollow portion farther from the bending edge, and an area of a first opening of a first hollow portion closer to a bending center is smaller than an area of a first opening of a first hollow portion farther from the bending center.

In one example, a same lead is provided with a plurality of first hollow portions in the predetermined bending region, in the predetermined bending region, in the same lead, a distribution density of the first hollow portions in a sub-region closer to a bending edge is greater than a distribution density of the first hollow portions in a sub-region farther from the bending edge, and a distribution density of the first hollow portions in a sub-region closer to a bending center is smaller than a distribution density of the first hollows portion in a sub-region farther from the bending center.

In one example, the leads have a bottom surface in contact with the first insulating layer; in a cross section perpendicular to a surface of the flexible display panel, an angle between a cross-sectional boundary of the first hollow portion and the bottom surface is a first angle, and the first angle is from 45° to 95°.

In one example, at least one of the leads further comprises a first portion between the predetermined bending region and an edge of the flexible display panel, the at least one of the leads is provided with at least one second hollow portion in the first portion, and the first insulating layer and the second insulating layer are further connected via the at least one second hollow portion.

In one example, in the cross section perpendicular to the surface of the flexible display panel, an angle between a cross-sectional boundary of the second hollow portion and the bottom surface is a second angle, and the second angle is smaller than the first angle.

In one example, the predetermined bending region is between a display region of the flexible display panel and an edge of the flexible display panel; a plurality of signal lines are disposed in the display region, at least one of the leads further comprises a second portion between the display region and the predetermined bending region, for connecting the signal lines; the at least one of the leads is provided with a third hollow portion in the second portion, and the first insulating layer and the second insulating layer are further connected via the third hollow portion.

In one example, in the cross section perpendicular to the surface of the flexible display panel, an angle between a cross-sectional boundary of the third hollow portion and the bottom surface is a third angle, and the third angle is smaller than the first angle.

In one example, a same lead is provided with a plurality of first hollow portions in the predetermined bending region, and respective one of the first hollow portions has a first opening facing the first insulating layer; in the predetermined bending region, in the same lead, an area of a first opening of a first hollow portion in a portion having a wider line width is larger than an area of a first opening of a first hollow portion in a portion having a narrower line width.

In one example, respective one of the leads is provided with a plurality of first hollow portions in the predetermined bending region, and the plurality of first hollow portions are arranged separately along an extending direction of respective one of the leads; a distribution density of the first hollow portions of respective one of the leads decreases as a length of respective one of the leads increases.

In one example, volumes of the plurality of first hollow portions of respective one of the leads are substantially equal.

In one example, respective one of the leads is provided with a plurality of first hollow portions in the predetermined bending region, and the plurality of first hollow portions are arranged separately along an extending direction of respective one of the leads; a total hollow volume of the first hollow portions of respective one of the leads decreases as a length of each of the leads increases.

In one example, the first hollow portion is a through hole; a minimum line width of the leads is larger than 4/3 of a maximum aperture of an upper hole of the through hole and less than 3 times the maximum aperture of the upper hole of the through hole, and the upper hole of the through hole is away from the first insulating layer.

Another embodiment of the present disclosure provides a flexible display device including any of the above flexible display panels.

BRIEF DESCRIPTION OF THE DRAWINGS

In order to more clearly illustrate the embodiments of the present disclosure or the technical solutions in the existing art, the drawings to be used in the embodiments or the description of the existing art will be briefly described below. Obviously, the drawings in the following description are only some of the embodiments of the present disclosure, and those skilled in the art can obtain other drawings based on these drawings without any inventive effort.

DETAILED DESCRIPTION

Figure 1:
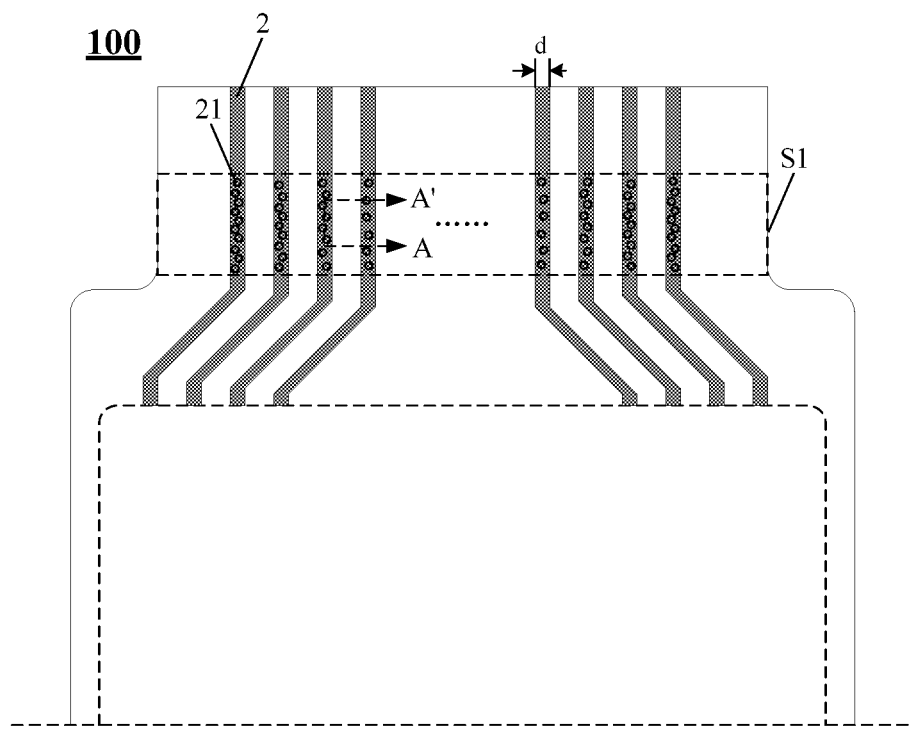
FIG. 1 is a schematic top view of a flexible display panel according to an embodiment of the present disclosure.

For the purpose of clearer purpose, technical solutions and advantages of the disclosed embodiments, the technical solutions of the embodiments of the present disclosure will be clearly and completely described below in conjunction with the drawings of the embodiments of the present disclosure. It is apparent that the described embodiments are part of the embodiments of the present disclosure, and not all of the embodiments. All other embodiments obtained by those skilled in the art based on the described embodiments of the present disclosure without any inventive effort are within the scope of the disclosure.

Exemplarily, the terms "first", "second" and similar terms used in the description and claims of the present disclosure are not intended to represent any order, amount, or importance, and are merely used to distinguish different components, exemplary. The word "include" or "comprise" or the like means that the element or item preceding the word covers the element or item enumerated after the word and its equivalent, without excluding other elements or items. The orientation or positional relationship indicated by the terms "up/above", "down/below", and the like is based on the orientation or positional relationship shown in the drawings, and is merely for convenience of explanation of the technical solution of the embodiments of the present disclosure, and is not intended to indicate or imply that the device or component referred to has a particular orientation, is constructed and operated in a particular orientation, and therefore is not to be construed as limiting the disclosure.

The embodiments of the present disclosure provide a flexible display panel and a flexible display device, which can solve the problem that the leads passing through a predetermined bending region in a flexible display panel suffer a failure of separation from insulating layers when the panel is bent, thereby improving product performance.

Figure 2:
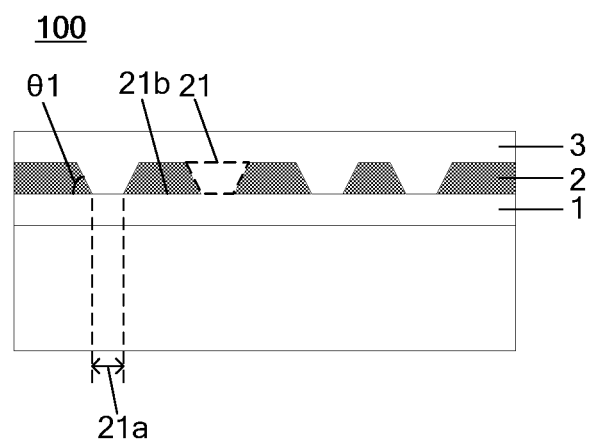
FIG. 2 is a schematic cross-sectional view taken along line A-A' of FIG. 1.

As shown in FIG. 1 and FIG. 2, an embodiment of the present disclosure provides a flexible display panel 100 including: a first insulating layer 1 (not shown in FIG. 1); a plurality of leads 2 disposed above the first insulating layer 1, the extending direction of the leads 2 passing through a predetermined bending region S1 of the flexible display panel 100; and a second insulating layer 3 (not shown in FIG. 1) disposed above each of the leads 2; the leads 2 are provided with first hollow portions 21 in the predetermined bending region S1, and the first insulating layer 1 and the second insulating layer 3 are connected via the first hollow portions 21.

It should be noted that the flexible display panel has a display region for displaying an image, and a plurality of signal lines are disposed in the region, and the leads are in one-to-one correspondence with the signal lines, thereby providing corresponding signals for the signal lines.

Figure 3:
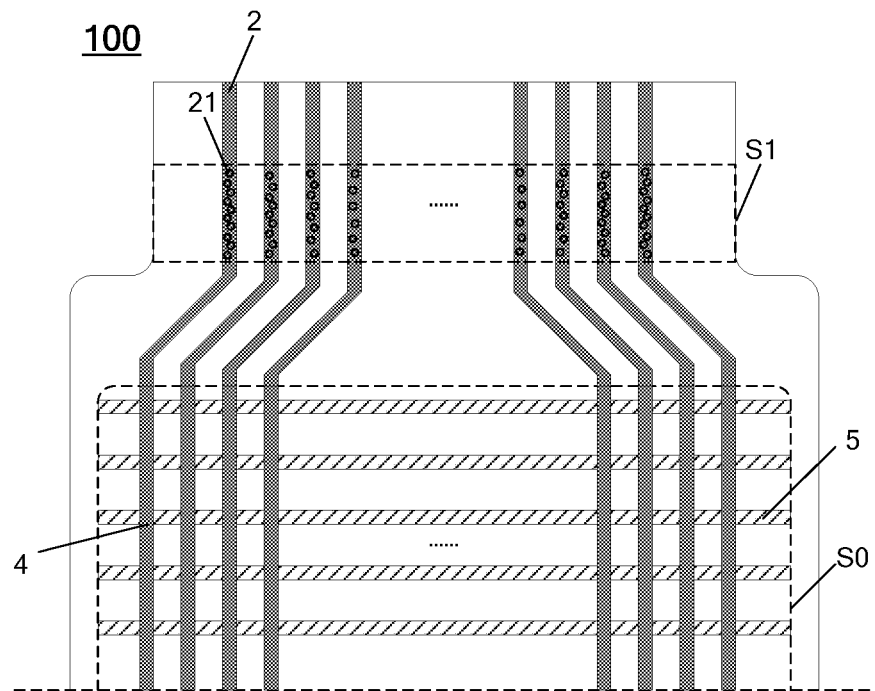
FIG. 3 is a schematic top view of a flexible display panel according to an embodiment of the present disclosure.

For example, as shown in FIG. 3, the signal lines in the display region S0 can be divided into a plurality of data lines 4 and a plurality of gate lines 5 with an insulating layer interposed between the data lines and the gate lines. The intersection of the data lines and the gate lines defines pixel regions, the data lines provide display signals for the pixel region, and the gate lines provide scan switching electric fields.

For example, referring to FIG. 3, as for the leads in one-to-one connection with the data lines, the leads may be, for example, data line leads.

The data line leads may be formed by using a metal material for preparing the data lines. Further, the data lines and the data line leads may be integrally formed, that is, simultaneously formed by the same patterning process.

As for the leads in one-to-one connection with the gate lines, the leads may be, for example, gate line leads.

The gate line leads may be formed by using a metal material for preparing the gate lines. Further, the gate lines and the gate line leads may be integrally formed, that is, simultaneously formed by the same patterning process.

In the flexible display panel, an insulating layer is disposed above a data line layer and an insulating layer is disposed below the data line layer, for the leads (i.e., data line leads) disposed in the same layer as the data lines and connected to the data lines, the first insulating layer 1 below the leads and the second insulating layer 3 above the leads may be portions of the insulating layer below the data line layer extending beyond the display region of the flexible display panel and portions of the insulating layer above the data line layer extending beyond the display region of the flexible display panel, respectively.

Similarly, in the flexible display panel, an insulating layer is disposed above a gate line layer and an insulating layer is disposed below the gate line layer, for the leads (i.e., gate line leads) disposed in the same layer as the gate lines and connected to the gate lines, the first insulating layer 1 below the leads and the second insulating layer 3 above the leads may be portions of the insulating layer below the gate line layer extending beyond the display region of the flexible display panel and portions of the insulating layer above the gate line layer extending beyond the display region of the flexible display panel, respectively.

The specific types of the first insulating layer 1 below the leads 2 and the second insulating layer 3 above the leads 2 are not limited in the embodiments of the present disclosure, as long as the leads 2 are disposed above the first insulating layer 1, that is, the leads 2 are provided with a substrate, and the second insulating layer 3 is disposed above the leads 2, and is connected to the opposite first insulating layer 1 via the first hollow portions 21 of the leads 2.

It should be understood that the first hollow portions 21 described above refer to through structure formed in the leads 2 that penetrate the leads 2, so that the first hollow portions 21 of the leads 2 can expose the first insulating layer 1 below the leads after the leads 2 are formed and before the second insulating layer 3 is formed, so that the second insulating layer 3, formed after the leads 2 are formed, can connect to the first insulating layer 1 via the first hollow portions 21 after the second insulating layer 3 cover the leads 2 from the above.

Moreover, a distribution density of the first hollow portions 21 of each of the leads 2 (that is, the number of the first hollow portions 21 within a certain length) and the shape are not specifically limited, and can be flexibly adjusted according to further design requirements.

Only a certain number of the leads 2 in the above flexible display panel 100 are illustrated in FIG. 1 described above. The specific number of the leads 2 can be flexibly adjusted according to the specific parameters such as the specific size and the pixel density of the flexible display panel 100, and the embodiments of the present disclosure are not limited in this aspect.

Because the leads are made of a conductive material such as a metal or an alloy, each of the leads corresponds to a conductive layer, and the material composition of the conductive layer is structurally significantly different from that of the insulating layer, and therefore, the molecular bonding force between the leads and the insulating layers is less than the molecular binding force between the insulating layers. In this way, when the flexible display panel is flexibly bent, the contact surface between the leads and the insulating layers located in the bending region is likely to be separated due to the small molecular bonding force.

As to the above, with the above flexible display panel 100 according to the embodiments of the present disclosure, the first hollow portions 21 are formed in a portion of the leads 2 in the predetermined bending region, so that the first insulating layer 1 below the leads 2 is connected to the second insulating layer 3 above the leads 2, that is, a certain interface transition region is formed between the leads and the insulating layers, and the bonding force between the first insulating layer 1 and the second insulating layer 3 becomes stronger, and the attachment is increased, thereby reducing or avoiding the possibility of separation of the leads 2 from the upper and lower insulating layers in contact with each other during bending, especially during repeated bending, to improve product yield.

In each of the leads 2 described above, the shapes of the first hollow portions 21 include, but are not limited to, a circular hole shape as shown in FIG. 1, as long as each of the leads 2 does not have a completely broken region, thereby ensuring each of the leads 2 can transmit signal normally.

Herein, taking the first hollow portions 21 which are through holes as an example, when the upper hole width (i.e., the aperture) of a through hole away from the first insulating layer 1 is relatively closer to the line width of a lead 2, due to the deviation of the preparation process, when the through hole is formed by etching or the like, it is easy to incur a completely broken region in the lead 2, and the lead 2 cannot transmit the signal normally; further, when the upper hole width (i.e., the aperture) of a through hole away from the first insulating layer 1 is too small compared to the line width of a lead 2, the through hole is more difficult to be prepared. Herein, the upper hole refers to, for example, the opening that is formed in a through hole 21 on the surface of the lead 2 away from the first insulating layer 1.

Therefore, based on the above considerations, the embodiments of the present disclosure further provide an implementation in which the minimum line width of the leads 2 is, for example, larger than 4/3 of the maximum aperture of the upper holes of the through holes away from the first insulating layer 1, and less than 3 times the maximum aperture of the upper holes. Herein, the minimum line width of the leads 2 refers to the minimum distance d between the two outer boundaries, see FIG. 1. In FIG. 1, each of the leads 2 has a substantially uniform width.

It can be understood that "maximum aperture" described above refers to a widest size of the aperture of the upper hole of a through hole. For example, when the shape of the upper hole is elliptical, the maximum aperture is the long axis width of the ellipse; when the upper hole pattern is circular, the maximum aperture is the diameter of the circle.

Referring to FIG. 2, the first hollow portions 21 have first openings 21a facing the first insulating layer 1, and the portions of the first insulating layer 1 exposed by the first openings 21a are portions connected to the second insulating layer 3.

Referring to FIG. 1, an embodiment of the present disclosure further provides another implementation in which at least one of the leads 2 is provided with a plurality of first hollow portions 21 in the predetermined bending region S1 described above, and the plurality of first hollow portions 21 are arranged separately along an extending direction of the at least one of the leads 2, the separation force between the leads and the insulating layers generated by the different degrees of bending can be adjusted by the different sizes of the first openings 21a of the different first hollow portions 21 of a single lead 2 and/or a specific distribution of the first hollow portions 21 of the same lead 2. Herein, the extending direction of the leads 2 is, for example, the length direction in which the maximum size of the leads is located.

For example, in the above-described predetermined bending region S1, the area of the first openings 21a, closer to a bending edge, of the first hollow portions 21 in the sub-region is larger than the area of the first opening 21a, closer to a bending center, of the first hollow portions 21 in the sub-region. Herein, referring to FIG. 1, two mutually parallel bending edges of the predetermined bending region S1 are shown by broken lines, and are both parallel to the edge of the display region S0 facing the predetermined bending region S1. The center line position of the two bending edges of the predetermined bending region S1. Herein, when the flexible display panel 100 is bent, for a sub-region closer to the bending edges in the predetermined bending region S1, because the sub-region is located at a boundary where the panel is bent and not bent, there occurs the case where the stress distribution is uneven inside, and the lead 2 and the upper and lower insulating layers which are in contact with each other are more likely to be separated.

In contrast, for the sub-region located in the predetermined bending region S1 near the center of the bending, because the sub-region is entirely located in the region where the panel is bent, the stress distribution inside the panel is uniform after the panel is bent. The possibility that the lead 2 is separated from the upper and lower insulating layers in contact with each other is relatively low.

Therefore, the above-described implementation according to the embodiments of the present disclosure further provides the first hollow portions 21 having larger first openings 21*a* in the sub-region closer to the bending edges (i.e., the region where the stress distribution is more unevenly generated by the bending), so that the first insulating layer 1 below the leads 2 and the second insulating layer 3 above the leads 2 can be connected via more portions in the sub-region having a larger predetermined bending degree, thereby further improving the adhesion. For example, in the predetermined bending region, in the same lead, the area of a first opening of a first hollow portion closer to the bending edge is larger than the area of a first opening of a first hollow portion farther from the bending edge, and the area of a first opening of a first hollow portion closer to the bending center is smaller than the area of a first opening of a first hollow portion farther from the bending center.

Similarly, in the above-described predetermined bending region S1, the distribution density of the first hollow portions 21 in the sub-region closer to the bending edge may be set to be larger than the distribution density of the first hollows 21 in the sub-region closer to the bending center. For example, in the predetermined bending region, in the same lead, the distribution density of the first hollow portions in a sub-region closer to the bending edge is greater than the distribution density of the first hollow portions in a sub-region farther from the bending edge, and the distribution density of the first hollow portions in a sub-region closer to the bending center is smaller than the distribution density of the first hollows portion in a sub-region farther from the bending center.

In this way, more first hollow portions 21 are designed in the sub-region closer to the bending edge (i.e., the region where the stress distribution is more unevenly generated by the bending), so that the first insulating layer 1 below the leads 2 and the second insulating layer 3 above the leads 2 can be connected via more first hollow portions 21 in a sub-region having a larger predetermined bending degree, thereby further improving the adhesion.

On the basis of the above, the present disclosure further provides another embodiment, referring to FIG. 2, the leads 21 has a bottom surface 21*b* in contact with the first insulating layer 1. In a cross section perpendicular to the surface of the flexible display panel 100, the angle between the cross-sectional boundary of a first hollow portion 21 and the bottom surface is a first angle (labeled as θ1 in FIG. 2), and the range of the first angle is, for example, from 45° to 95°.

Herein, that the first angle is selected in the above range (the range includes 45° and 95°) can avoid a longer contact boundary of the contact portion of the second insulating layer 3 that is in contact with the lead 2 in the first hollow portion 21 due to a too small angle, because the longer contact boundary increases the possibility that the second insulating layer 3 and the lead 21 are separated at the longer cross-sectional boundary during bending, further, also can avoid the difficulty in preparing the first hollow portion 21 because of the excessive difference between the upper and lower opening areas of the first hollow portion 21 due to the excessive angle.

Figure 4:
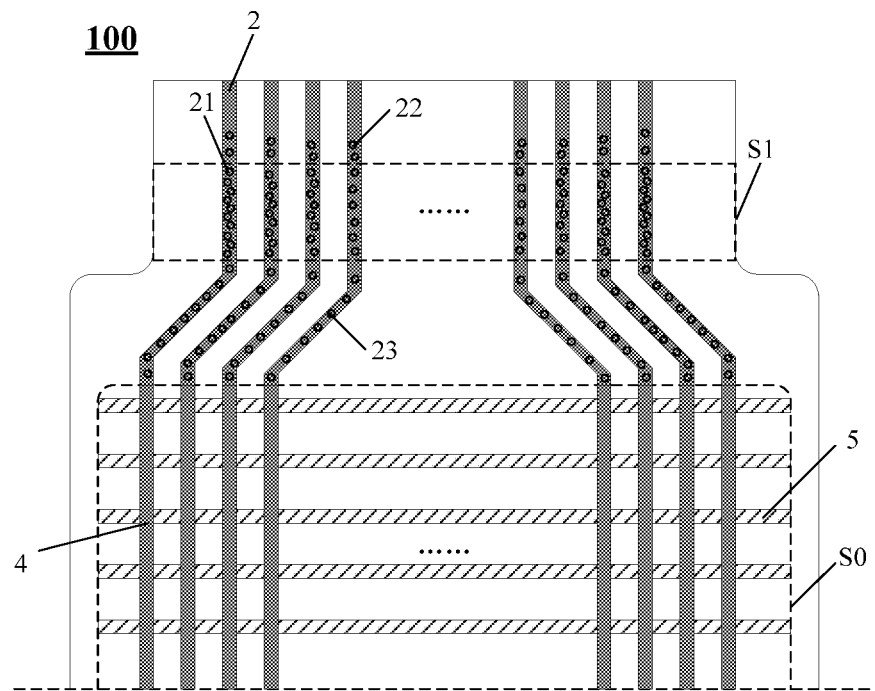
FIG. 4 is a schematic top view of a flexible display panel according to an embodiment of the present disclosure.

On the basis of the above, as shown in FIG. 4, at least one of the leads 2 is further provided with a second hollow portion 22 in a portion that is outside the predetermined bending region S1 and closer to the edge of the flexible display panel, the first insulating layer 1 and the second insulating layer 3 is further connected via the second hollow portion 22.

Herein, the portion of the leads 2 closer to the edge of the flexible display panel is usually the portion connected to a connection terminal (or a signal extraction terminal) of the control circuit, and the possibility of bending at the connection terminal is low, the region where the leads 2 are closer to the connection terminal is provided with second hollow portions 22, which can disperse the stress generated inside the leads 2 when are bent.

Figure 5:
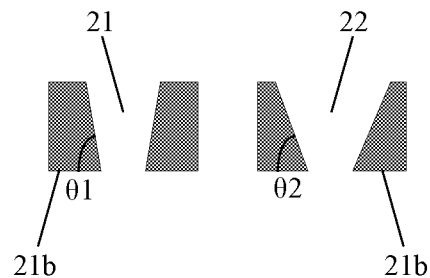
FIG. 5 is a schematic cross-sectional view of a first hollow portion and a second hollow portion in a flexible display panel according to an embodiment of the present disclosure.

Further, as shown in FIG. 5, along a vertical direction of the flexible display panel, the angle between the cross-sectional boundary of the second hollow portion 22 and the bottom surface 21*b* is a second angle (labeled as θ2 in FIG. 5). As an embodiment, the second angle θ2 is smaller than the first angle θ1 of a first hollow portion 21, so that the cross-sectional boundary of the second hollow portion 22 of the leads 2 in a region closer to the connection terminal is longer, further dispersing the stress generated inside the entire insulating layer when the first insulating layer 1 and the second insulating layer 3 are bent.

Herein, taking the first hollow portion 21 and the second hollow portion 22 which are through holes as an example, the area of the opening of the second hollow portion 22 on the surface of the leads 2 away from the first insulating layer may be designed to be larger than the area of the opening of the first hollow portion 21 on the surface of the leads 2 away from the first insulating layer. With the anisotropic property of the dry etching, the angle formed between the cross-sectional boundary of the through-hole 22 and the bottom surface can be smaller than the angle between the cross-sectional boundary of the through-hole 21 and the bottom surface during the same etching process, thereby the cross-sectional boundary of the second hollow portion 22 on the region where the leads 2 are closer to the connection terminal is longer.

Similarly, referring to FIG. 4, the predetermined bending region S1 is between the display region S0 of the flexible display panel and the edge of the flexible display panel; and a plurality of signal lines (the signal line is data line, labeled as 4 for example in FIG. 4) are disposed in the display region; the leads 2 are between the display region S0 and the edge of the flexible display panel for connecting the signal lines 4; at least one of the leads is further provided with a third hollow portion 23 in a portion that is outside the predetermined bending region S1 and closer to the display region S0, and the first insulating layer 1 and the second insulating layer 3 are further connected via the third hollow portion 23.

Herein, the possibility that the leads 2 are bent in a position closer to the display region S0 is low, and the region where the leads 2 are closer to the display region S0 is provided with third hollow portions 23, which can disperse the stress generated inside the entire leads when the leads 2 are bent.

Figure 6:
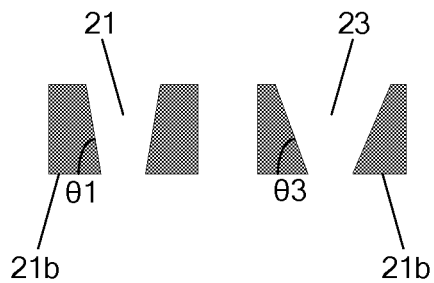
FIG. 6 is a schematic cross-sectional view of a first hollow portion and a third hollow portion in a flexible display panel according to an embodiment of the present disclosure.

Further, as shown in FIG. 6, along a vertical direction of the flexible display panel, the angle between the cross-sectional boundary of the third hollow portion 23 and the bottom surface is a third angle (labeled as θ3 in FIG. 6). As another embodiment, the third angle θ3 is smaller than the first angle θ1 of the first hollow portion 21, so that the cross-sectional boundary of the third hollow portion 23 on the region where the leads 2 are closer to the display region is longer, further dispersing the stress generated inside the entire insulating layer when the first insulating layer 1 and the second insulating layer 3 are bent.

Herein, taking the first hollow portion 21 and the third hollow portion 23 that are through holes as an example, the area of the opening of the third hollow portion 23 on the surface of the leads 2 away from the first insulating layer may be designed to be larger than the area of the opening of the first hollow portion 21 on the surface of the leads 2 away from the first insulating layer. By using the anisotropic property of dry etching, the angle formed between the cross-sectional boundary of the through-hole 23 and the bottom surface can be smaller than the angle between the cross-sectional boundary of the through-hole 21 and the bottom surface during the same etching process, thereby the cross-sectional boundary of the third hollow portion 23 on the region where the leads 2 are closer to the display region is longer.

That is, on the leads 2, the second hollow portions 22, which are located outside the predetermined bending region S1 and closer to the edge of the flexible display panel, and the third hollow portions 23, which are located outside the predetermined bending region S1 and closer to the display region S0, have a certain transitional effect and disperses the stress generated in the leads 2 due to the occurrence of bending.

Figure 7:
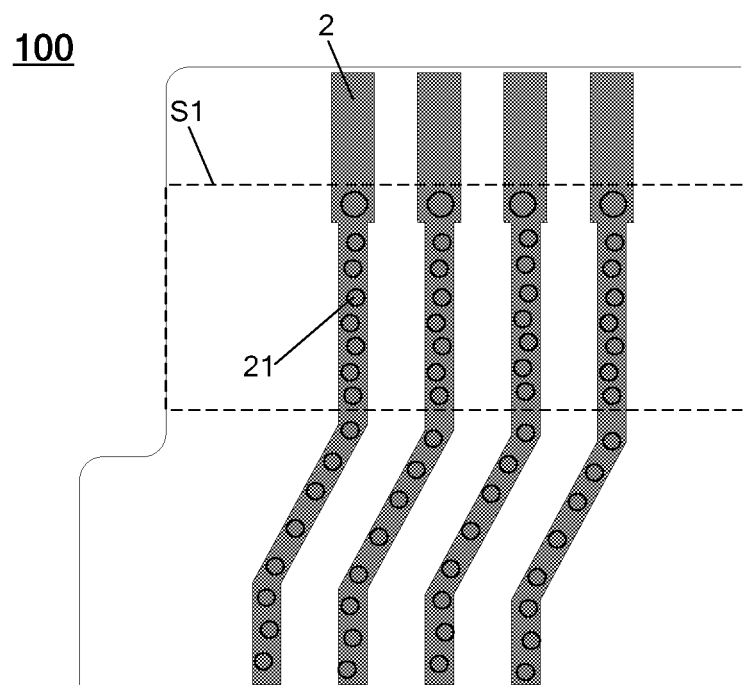
FIG. 7 is an enlarged schematic partial top view of a flexible display panel according to an embodiment of the present disclosure.

Further, as shown in FIG. 7, in the predetermined bending region S1, in a lead, the first opening of the first hollow portion 21 in a portion having a wider line width is larger than the first opening of the hollow portion 21 in a portion having a narrower line width. The first opening is the opening of the first hollow portion 21 facing the first insulating layer. Herein, the first opening may mean the opening of the first hollow portion 21 formed on the surface of the leads 2 facing the first insulating layer.

Herein, because the contact area between the lead 2 and the insulating layers becomes large as the line width is widened, the separation of the lead 2 from the insulating layers is more likely to occur during bending, and therefore, the first opening of the first hollow portion 21 in a portion where the line width is widened is made larger, that is, the insulating layer below the lead 2 and the insulating layer above the lead 2 are connected via more portions, further reducing the probability of separation of the lead from the insulating layers.

Herein, an example of the portion where the line width is widened may be a position where a plurality of leads with hollows are arranged side by side.

Taking the first hollow portion 21 that is a through hole as an example, that is, the through hole in the portion where the line width is widened has a larger aperture.

On the basis of the above, the leads are led out from the display region and extend to one side edge of the flexible display panel and are connected to the connection terminals to transmit received corresponding signals to the signal lines (such as the data lines and the gate lines) in the display region. In order to facilitate bending of the flexible display panel, the width of the display region in the flexible display panel is generally greater than the width of one side edge closer to the connection terminal, that is, there is a tightening region from the display region to the side edge.

Due to the large number of signal lines in the display region, the number of leads led out from the display region is correspondingly larger, in the region between the display region and the side edge which is closer to the connection terminals, the leads located at a central position between the display region and the side edge which is closer to the connection terminals route shorter distances from the display region to the connection terminal (i.e., the leads are shorter), and the leads at the edge positions extending from the center to both sides route longer distances from the display region to the connection terminals (i.e., the leads are longer), thereby, in the region between the display region and the side edge which is closer to the connection terminals, the plurality of leads exhibit the feature of gradually increasing the lengths from the center to the edges.

The line resistance R has the following expression:

$$R=\rho*L/S,$$

$$S=d*w,$$

where ρ is resistivity, L is the length of a line, S is the cross-sectional area of the line, d is the thickness of the line, and w is the width of the line.

It can be seen from the above expression that, as for the line having the same resistivity p and the same cross-sectional area S of the line, the longer the line length L is, the larger the resistance is.

In the flexible display panel, each of the leads is usually formed by the same patterning process, the resistivity p is the same, and the thickness d is the same, and because the large number of leads, the line width W of each of the leads is generally the same or very close.

Therefore, because a plurality of leads exhibit the gradual increase in length from the center to the edges, the resistance of each of the leads is also different, and the greater the resistance, the greater the degree of signal transmission delay, which affects the display quality.

At present, in the related art, serpentine bending structures such as fold lines having different lengths are designed for the leads at different positions so that the lengths of the lines at the respective positions are the same or approximately the same, so as to solve the problem that the lead resistances at different positions are inconsistent.

However, the inventors have further noted in research that, as for a flexible display panel with a high-definition display, because the resolution of the display screen is larger, the number of pixel units per unit area is also larger, the number of corresponding signal lines and leads is also larger, there is less wiring space around the display region, and it is impossible to compensate for the problem of poor resistance uniformity due to inconsistent lead lengths at different positions by preparing complicated serpentine trace structures outside the display region.

Based on the above, in order to further solve or alleviate the problem of poor resistance uniformity caused by inconsistent lead lengths at different positions, embodiments of the present disclosure can adjust the resistance difference of leads 2 of different lengths by at least the number and size of the first hollow portions 21 of different leads 2, including the following two adjustment methods.

Method One

Figure 8:
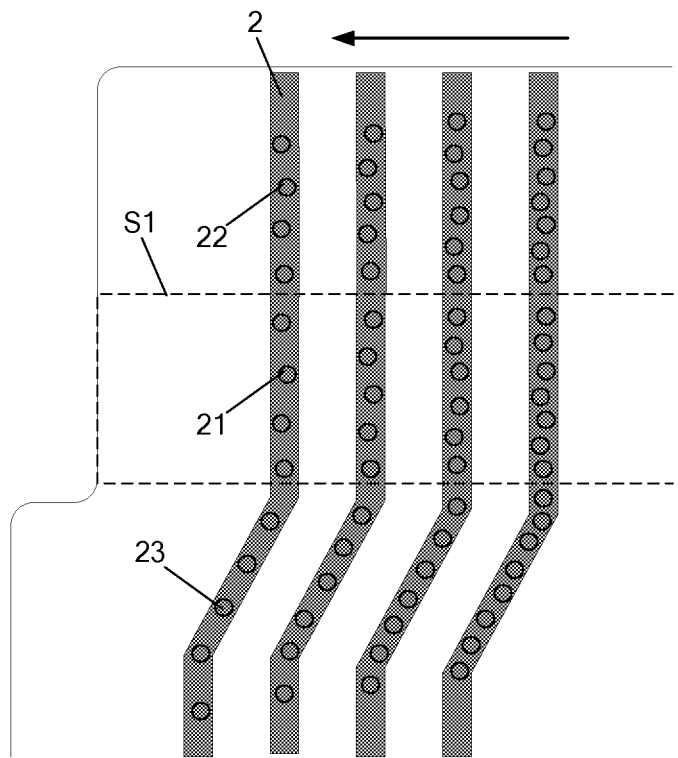
FIG. 8 is an enlarged schematic partial top view of a flexible display panel according to an embodiment of the present disclosure.

As shown in FIG. 8, each of the leads 2 is provided with a plurality of first hollow portions 21 in the predetermined bending region S1, the plurality of first hollow portions 21 are arranged separately along the extending direction of the lead 2; the length of each of the leads 2 gradually increases from the center to an edge (the pointing direction is shown by the arrow in FIG. 8), and the distribution density (i.e., the number) of the first hollow portions 21 of each of the leads 2 gradually decreases as the length of each of the leads 2 increases. Herein, for example, the volumes of the plurality of first hollow portions of each of the leads are substantially equal.

According to the expression of the above-described trace resistance R, when p, L, and d are not changed, the smaller the line width w is, the larger the resistance is. Provision of the first hollow portions 21 on a lead corresponds to reducing the line width of the lead at the positions where the first hollow portions 21 are provided, and the resistance is increased.

The shorter the length of a lead is, the smaller the resistance of the lead is; the first hollow portions 21 having a larger distribution density can be disposed in the lead to increase the resistance of the lead.

That is, the shorter the length of a lead is, the more the first hollow portions 21 are distributed on the lead; on the other hand, the longer the length of the lead is, the less the first hollow portions 21 are distributed on the lead, thereby the resistance of the different leads 2 are adjusted by the distribution density of the first hollow portions 21.

It should be noted that the specific degree to which the distribution density of the first hollow portions 21 of the leads gradually decreases with the increase of the length of the leads 2 can be obtained by corresponding calculation, which is not limited in the present disclosure.

Herein, as shown in FIG. 8, the portion of each of the leads 2 closer to a connecting terminal is further provided with second hollow portions 22, the portion of each of the leads 2 closer to a display region is further provided with third hollow portions 23, the second hollow portions 22 and the third hollow portions 23 may be further disposed in such a manner that the distribution density gradually decreases as the length of each of the leads 2 increases.

Method Two

Figure 9:
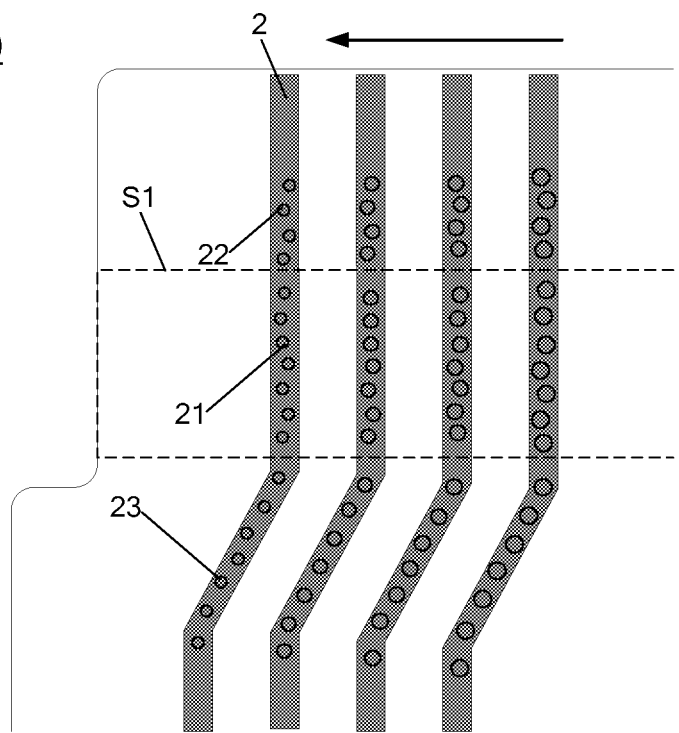
FIG. 9 is an enlarged schematic partial top view of a flexible display panel according to an embodiment of the present disclosure.

As shown in FIG. 9, each of the leads 2 is provided with a plurality of first hollow portions 21 in the predetermined bending region S1, the plurality of first hollow portions 21 are arranged separately along the extending direction of the lead 2; the length of each of the leads 2 gradually increases from the center to an edge (the pointing direction is shown by the arrow in FIG. 9), and the total hollow volume of the first hollow portions 21 of each of the leads 2 gradually decreases as the length of each of the leads 2 increases.

Herein, the volumes of the first hollow portions 21 are sizes of the leads 2 which are hollowed out, because each of the leads 2 is usually formed by the same preparation process, the thickness is the same or very close, the volume difference of the first hollow portions 21 actually depends on sizes of openings of the first hollow portions 21.

Taking the first hollow portions 21 that are through holes as an example, the larger the volumes of the first hollow portions 21 are, the larger the apertures are, which corresponds to reducing the line width of the lead at the position where the first hollow portions 21 are provided, and the resistance is increased.

The shorter the length of a lead is, the smaller the resistance of the lead is; the first hollow portions 21 having a larger hollow portion volume can be disposed in the lead to increase the resistance of the lead.

That is, the shorter the length of the lead is, the larger the total hollow volume of the first hollow portions 21 distributed on the lead is; on the other hand, the longer the length of a lead is, the less the total hollow volume of the first hollow portions 21 distributed on the lead is, thereby the resistance of different leads 2 are adjusted by the sizes of the first hollow portions 21.

It should be noted that the specific degree to which the total hollow volume of the first hollow portions 21 of a lead gradually decreases with the increase of the length of the lead 2 can be obtained by corresponding calculation, which is not limited in the embodiments of the present disclosure.

Herein, as shown in FIG. 9, the portion of each of the leads 2 closer to a connecting terminal is further provided with second hollow portions 22, the portion of each of the leads 2 closer to a display region is further provided with third hollow portions 23, the second hollow portions 22 and the third hollow portions 23 may be further disposed in such a manner that the sizes gradually decrease as the length of each of the leads 2 increases.

Based on the above, the flexible display panel provided by the embodiments of the present disclosure can solve the problem of separation of the leads from the insulating layers due to the absence of the interface transition region between the leads and the insulating layers during bending, and further alleviate the problem that the resistances of leads of different lengths are inconsistent by adjusting the number and size of the first hollow portions of the different leads 2, thereby satisfying the display requirements of high definition display products.

On the basis of the above, an embodiment of the present disclosure further provides a method for preparing a flexible display panel, and the preparation method includes the following processes:

Step S1, forming a first insulating layer;

Step S2, forming a plurality of leads above the first insulating layer, the extending direction of the leads passing through a predetermined bending region of the flexible display panel; forming first hollow portions in the leads in the predetermined bending region, the first hollow portions exposing the first insulating layer; and Step S3, forming a second insulating layer, the second insulating layer and the first insulating layer being connected via the first hollow portions.

Herein, after the plurality of leads are formed above the first insulating layer, the first hollow portions of the leads exposing the first insulating layer are formed by a patterning process.

Herein, a typical patterning process refers to such a process of applying a mask to expose the photoresist on the surface of a film (Photo), developing, and etching (such as dry etching) the part exposed by the photoresist to form a particular pattern and remove the photoresist.

The structure of the first hollow portions may be through holes.

In an optional method, further, the formed first hollow portion has a first opening facing the first insulating layer; and in the predetermined bending region, the first opening of the first hollow portion in a sub-region having a larger predetermined bending degree is larger than the first opening of the first hollow portion in a sub-region having a smaller predetermined bending degree.

In another optional method, further, in the predetermined bending region, the distribution density of the first hollow portions in a sub-region having a larger predetermined bending degree is larger than the distribution density of the first hollow portion in a sub-region having a smaller predetermined bending degree.

Further, the formed lead has a bottom surface in contact with the first insulating layer; along the vertical direction of the flexible display panel, an angle between the cross-sectional boundary of a first hollow portion and the bottom surface is a first angle, and the first angle is ranged from 45° to 95°.

Further, the portion if at least one of the leads, which is outside the predetermined bending region and closer to the edge of the flexible display panel, is further provided with a second hollow portion, the first insulating layer and the second insulating layer are further connected via the second hollow portion.

Further, along the vertical direction of the flexible display panel, the angle formed between the cross-sectional boundary of the second hollow portion and the bottom surface is a second angle, and the second angle is smaller than the first angle.

Further, the predetermined bending region is between the display region of the flexible display panel and the edge of the flexible display panel; and a plurality of signal lines are formed in the display region; the leads 2 are formed between the display region and the edge of the flexible display panel for connecting the signal lines; the portion of at least one of the leads, which is outside the predetermined bending region and closer to the display region, is further provided with a third hollow portion, and the first insulating layer and the second insulating layer are further connected via the third hollow portion.

Further, along the vertical direction of the flexible display panel, the angle formed between the cross-sectional boundary of the third hollow portion and the bottom surface is a third angle, and the third angle is smaller than the first angle.

Further, the formed first hollow portion has a first opening facing the first insulating layer; in the predetermined bending region, in the leads, the first opening of the first hollow portion in a portion having a wider line width is larger than the first opening of the hollow portion in a portion having a narrower line width.

Further, each of the leads is provided with a plurality of first hollow portions in the predetermined bending region, the plurality of first hollow portions are arranged separately along the extending direction of the leads; the length of each of the leads gradually increases from the center to an edge, and the distribution density of the first hollow portions of each of the leads gradually decreases as the length of each of the leads increases.

Further, each of the leads is provided with a plurality of first hollow portions in the predetermined bending region, the plurality of first hollow portions are arranged separately along an extending direction of the leads; the length of each of the leads gradually increases from the center to an edge, and hollow portion volumes of the first hollow portions of each of the leads gradually decreases as the length of each of the leads increases.

Figure 10:
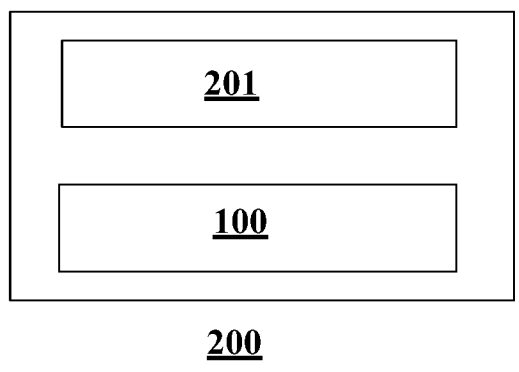
FIG. 10 is a schematic diagram of a flexible display device according to an embodiment of the present disclosure.

Based on the above, referring to FIG. 10, an embodiment of the present disclosure further provides a flexible display device 200 including above any flexible display panel 100. For example, the flexible display device 200 further includes a counter substrate 201 disposed opposite to the flexible display panel 100.

The display device may be specifically a product or a component having any display function, such as a display, a television, a mobile phone, a tablet computer, a smart wristband, a digital photo frame, and a navigator.

The above is only a specific embodiment of the embodiments of the present disclosure, but the scope of the embodiments of the present disclosure is not limited thereto, and changes or substitutions that can be easily conceived by those skilled in the art within the scope of the technology disclosed in the embodiments of the present disclosure are intended to be included within the scope of the present disclosure. Therefore, the scope of the present disclosure should be determined by the scope of the claims.

What is claimed is:

1. A flexible display panel, comprising:
a first insulating layer;
a plurality of leads above the first insulating layer, the plurality of leads passing through a predetermined bending region of the flexible display panel; and
a second insulating layer above the plurality of leads,
wherein at least one of the leads is provided with a plurality of first hollow portions in the predetermined bending region, and the first insulating layer and the second insulating layer are connected via at least one first hollow portion,
the at least one first hollow portion has a first opening facing the first insulating layer, and
in the predetermined bending region, an area of a first opening of a first hollow portion closer to a bending edge is larger than an area of a first opening of a first hollow portion farther from the bending edge, and an area of a first opening of a first hollow portion closer to a bending center is smaller than an area of a first opening of a first hollow portion farther from the bending center.

2. The flexible display panel according to claim 1, wherein
in the predetermined bending region, a distribution density of first hollow portions in a sub-region closer to the bending edge is greater than a distribution density of the first hollow portions in a sub-region farther from the bending edge, and a distribution density of the first hollow portions in a sub-region closer to the bending center is smaller than a distribution density of the first hollow portions in a sub-region farther from the bending center.

3. The flexible display panel of claim 1, wherein the leads have a bottom surface in contact with the first insulating layer, and
in a cross section perpendicular to a surface of the flexible display panel, an angle between a cross-sectional boundary of the at least one first hollow portion and the bottom surface is a first angle, and the first angle is from 45° to 95°.

4. The flexible display panel according to claim 3, wherein
the at least one of the leads further comprises a first portion between the predetermined bending region and an edge of the flexible display panel, the at least one of the leads is provided with at least one second hollow portion in the first portion, and the first insulating layer and the second insulating layer are further connected via the at least one second hollow portion.

5. The flexible display panel according to claim 4, wherein
in the cross section perpendicular to the surface of the flexible display panel, an angle between a cross-sectional boundary of the at least one second hollow portion and the bottom surface is a second angle, and the second angle is smaller than the first angle.

6. The flexible display panel according to claim 3, wherein
the predetermined bending region is between a display region of the flexible display panel and an edge of the flexible display panel;
a plurality of signal lines are disposed in the display region, the at least one of the leads further comprises a second portion between the display region and the predetermined bending region, for connecting the signal lines; and
the at least one of the leads is provided with a third hollow portion in the second portion, and the first insulating layer and the second insulating layer are further connected via the third hollow portion.

7. The flexible display panel according to claim 6, wherein
in the cross section perpendicular to the surface of the flexible display panel, an angle between a cross-sectional boundary of the third hollow portion and the bottom surface is a third angle, and the third angle is smaller than the first angle.

8. The flexible display panel according to claim 1, wherein
in the predetermined bending region, an area of a first opening of a first hollow portion in a portion having a wider line width is larger than an area of a first opening of a first hollow portion in a portion having a narrower line width.

9. The flexible display panel according to claim 1, wherein
the plurality of first hollow portions are arranged separately along an extending direction of the one of the leads; and
a distribution density of the first hollow portions of the one of the leads decreases as a length of the one of the leads increases.

10. The flexible display panel according to claim 9, wherein volumes of the plurality of first hollow portions are substantially equal.

11. The flexible display panel according to claim 1, wherein
the plurality of first hollow portions are arranged separately along an extending direction of the one of the leads; and
a total hollow volume of the first hollow portions decreases as a length of the one of the leads increases.

12. The flexible display panel according to claim 1, wherein the at least one first hollow portion is a through hole, a minimum line width of the at least one of the leads is larger than 4/3 of a maximum aperture of an upper hole of the through hole and less than 3 times the maximum aperture of the upper hole of the through hole, and the upper hole of the through hole is away from the first insulating layer.

13. The flexible display panel according to claim 5, wherein an area of an opening of the at least one second hollow portion on a surface of the at least one of the leads away from the first insulating layer is larger than an area of an opening of the at least one first hollow portion on the surface of the at least one of the leads away from the first insulating layer.

14. The flexible display panel according to claim 7, wherein an area of an opening of the third hollow portion on a surface of the at least one of the leads away from the first insulating layer is larger than an area of an opening of the at least one first hollow portion on the surface of the at least one of the leads away from the first insulating layer.

15. A flexible display apparatus, comprising a flexible display panel, wherein the flexible display panel comprises:
a first insulating layer;
a plurality of leads above the first insulating layer, the plurality of leads passing through a predetermined bending region of the flexible display panel; and
a second insulating layer above the plurality of leads,
wherein at least one of the leads is provided with a plurality of first hollow portions in the predetermined bending region, and the first insulating layer and the second insulating layer are connected via at least one first hollow portion,
the at least one first hollow portion has a first opening facing the first insulating layer, and
in the predetermined bending region, an area of a first opening of a first hollow portion closer to a bending edge is larger than an area of a first opening of a first hollow portion farther from the bending edge, and an area of a first opening of a first hollow portion closer to a bending center is smaller than an area of a first opening of a first hollow portion farther from the bending center.

* * * * *